United States Patent
Kwag et al.

(10) Patent No.: US 6,197,150 B1
(45) Date of Patent: Mar. 6, 2001

(54) APPARATUS FOR WAFER TREATMENT FOR THE MANUFACTURE OF SEMICONDUCTOR DEVICES

(75) Inventors: Gyu-hwan Kwag; Kyung-seuk Hwang, both of Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/320,139

(22) Filed: May 26, 1999

(30) Foreign Application Priority Data

Dec. 29, 1998 (KR) .................................................. 98-59906

(51) Int. Cl.⁷ .................................................. H01L 21/00
(52) U.S. Cl. ........................................... 156/345; 134/153
(58) Field of Search ........................... 156/345; 216/57, 216/92; 438/748, 745; 134/33, 153

(56) References Cited

U.S. PATENT DOCUMENTS

| | | | |
|---|---|---|---|
| 4,350,562 | * 9/1982 | Bonu | 156/345 |
| 4,745,422 | * 5/1988 | Matsuoka et al. | 134/153 |
| 4,871,417 | * 10/1989 | Nishizawa et al. | 216/92 |
| 5,279,704 | 1/1994 | Saito . | |
| 5,486,234 | 1/1996 | Contolini et al. . | |
| 5,874,366 | * 2/1999 | Sporer et al. | 156/345 |

\* cited by examiner

*Primary Examiner*—Thi Dang
(74) *Attorney, Agent, or Firm*—Jones Volentine, L.L.C.

(57) ABSTRACT

An apparatus is provided for wafer treatment during the manufacture of semiconductor devices. The apparatus for wafer treatment includes a shaft, a chuck supported by the shaft for holding a wafer to be treated, a solution nozzle for supplying a treatment solution for wafer treatment onto the wafer, a gas supplier for supplying a gas to the back side of the wafer, and a heater for heating the gas supplied to the back side of the wafer. The use of this apparatus improves the uniformity of a treatment process such as an etching process or a cleaning process by minimizing the temperature changes of the treatment solution supplied onto the wafer mounted on the spin chuck of the apparatus during the wafer treatment process.

19 Claims, 5 Drawing Sheets

APPARATUS FOR WAFER TREATMENT FOR THE MANUFACTURE OF SEMICONDUCTOR DEVICES

BACKGROUND OF THE INVENTION

The present invention relates to an apparatus for wafer treatment for the manufacture of semiconductor devices. More particularly, the present invention relates to an apparatus for wafer treatment for improving the process uniformity of a specific semiconductor device fabrication process, such as an etching or a cleaning, by minimizing the temperature changes of the treatment solution supplied on the wafer mounted on a spin chuck.

Generally, the process of manufacturing semiconductor devices involves a wide variety of steps including a layer formation process for forming multiple layers such as a polycrystalline layer, an oxide layer, a nitride layer, a metal layer, etc. on a wafer as a semiconductor substrate. These steps generally also include a diffusion process, a photolithography process, an etching process, a cleaning process, an ion implantation process, and the like, which are carried out between the steps of layer formation.

Among the process steps for manufacturing semiconductor devices, a wafer treatment process such as etching and cleaning processes, etc. may employ an apparatus for wafer treatment including a spin chuck used to rotate the wafer when it is mounted on the spin chuck.

In the above wafer treatment process using the apparatus for wafer treatment, the wafer is mounted on the spin chuck, and is rotated along with the rotating spin chuck. A specific process is then carried out for the wafer, such as etching some portion of the layers formed on the wafer or removing the particles existing on the wafer by supplying a respective treatment solution corresponding to the specific process. In either case, the process uses the centrifugal force of the rotating spin chuck and the pressure of the pressurized treatment solution when it is supplied to accomplish these goals.

Important process factors in the wafer treatment process include the rotation speed of the spin chuck, the kinds of the treatment solutions used for the wafer, the process temperature of the treatment solution, and the like. For example, the wafer treatment solution should be maintained at a temperature higher than room temperature when it is used in order to facilitate the reaction rate of the treated subject and the treatment solution in the aspect of the mass production of semiconductor devices and the reduction of the treatment time.

However, the actual process environment of the treatment process cannot completely satisfy these conditions. For example, when a treatment solution having a temperature of about 100° C. is supplied on the wafer rotating on the spin chuck, the treatment solution cannot maintain its original temperature of 100° C. due to the temperature difference between the treatment solution and the wafer. In other words, a temperature difference occurs when the treatment solution is initially contacted with the wafer, and as it moves to the peripheral edge of the wafer by the centrifugal force from the rotation of the spin chuck. The treatment solution has temperature higher than room temperature when it is initially supplied on the wafer, but its temperature changes, i.e., cools, as it contacts the wafer and moves along the surface of the wafer. Furthermore, the larger the diameter of wafer processed, the more and greater the temperature difference will be. This is particularly true for large wafers, such as those as large as 12 inches or more in diameter.

The temperature variation in the treatment solution as the process progresses causes a difference in the reaction rate of the treatment solution on respective portions of the wafer. This results in the deterioration of the uniformity of the treatment process itself, and disrupts the etching uniformity or cleaning uniformity of the wafer. These deteriorated uniformity problems are more serious in an etching process forming the contact hole plugs of a conductive material by a spin-etching method.

The higher integration of semiconductor devices that is increasingly needed requires a more precise etching process and cleaning process. As a result, it becomes necessary to increase the accuracy of spin etching processes.

SUMMARY OF THE INVENTION

The present invention is directed to providing an apparatus for wafer treatment for manufacturing semiconductor devices that can minimize the temperature changes of the treatment solution supplied on the wafer during the wafer treatment process, such etching or cleaning, to thereby improve the uniformity of the treatment process.

To achieve this and other advantages and in accordance with the purpose of the present invention, as embodied and broadly described, the apparatus for wafer treatment for manufacturing semiconductor devices may comprise a shaft, a chuck supported by the shaft and for holding a wafer, a solution nozzle for supplying a treatment solution to the wafer, a gas supplier for supplying a gas to the back side of the wafer, and a heater for heating the gas supplied to the back side of the wafer.

A chuck hot wire may be provided inside the chuck for heating the wafer held by the chuck. The shaft may include a gas supply passage for carrying the supplied gas, and the end of the gas supply passage is connected to the gas supplier. A buffer space may be formed under the bottom surface of the chuck, the buffer space being in communication with the gas supply passage.

A plurality of holes may be provided on the surface of the chuck in communication with the buffer space. These holes may be provided in a radial direction from the center of the chuck. A plurality of rectangular-shape grooves may also be provided on the surface of the chuck in the radial direction from the center of the chuck, and a plurality of holes may be provided inside the groove at equal intervals from each other, the holes being in communication with the buffer space.

The gas is preferably at a temperature between 30° C. to 150° C., and is preferably an inert gas. More preferably, the inert gas is nitrogen gas ($N_2$).

The apparatus for wafer treatment may further comprise a chamber for housing the chuck and the solution nozzle, and the outside of the chamber may be surrounded by a chamber hot wire.

In another aspect of the present invention, the apparatus for wafer treatment for manufacturing a semiconductor may comprise a shaft, a chuck supported by the shaft and for holding a wafer, a solution nozzle for supplying a treatment solution to the wafer, and one or more gas nozzles provided on proximate to the solution nozzle, at a certain distance from the solution nozzle, for supplying a certain gas.

A chuck hot wire may be provided inside the chuck for heating the wafer held by the chuck. The gas is preferably at a temperature between 30° C. to 150° C., and is preferably an inert gas. More preferably, the inert gas is nitrogen gas ($N_2$).

The apparatus for wafer treatment may further comprise a chamber for housing the chuck, the solution nozzle, and the gas nozzle, and the outside of the chamber may be surrounded by a chamber hot wire.

It is to be understood that both the foregoing general description and the following detailed description are exemplary and explanatory and are intended to provide further explanation of the invention as claimed.

BRIEF DESCRIPTION OF THE DRAWINGS

These and other objects, feature and advantages of the present invention will be described with reference to the accompanying drawings, in which.

DETAILED DESCRIPTION OF PREFERRED EMBODIMENTS

Preferred embodiments of the present invention will now be described in detail with reference to the accompanying drawings.

A First Preferred Embodiment

Figure 1:
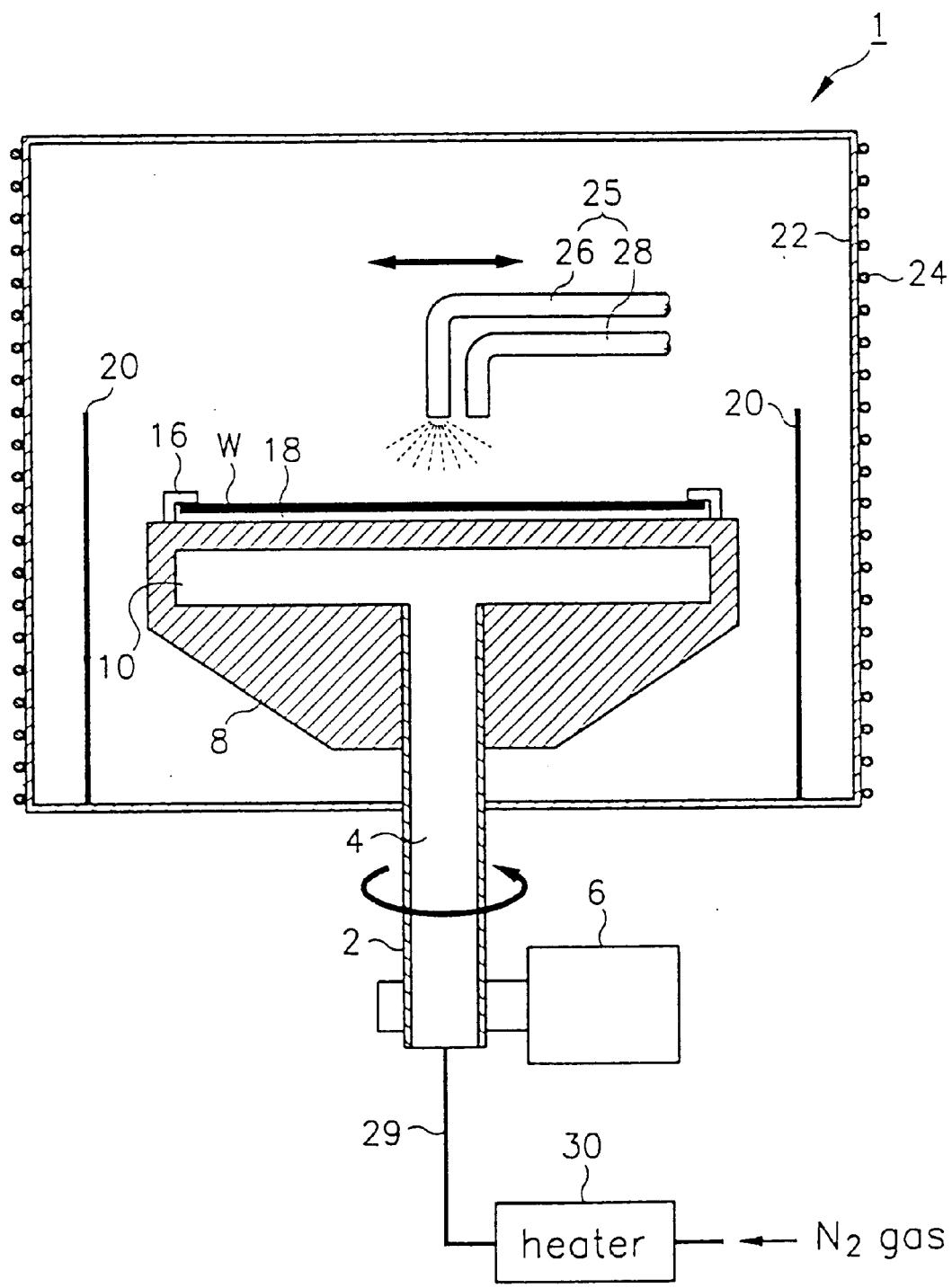
FIG. 1 schematically shows an apparatus for wafer treatment for the manufacture of semiconductor devices according to a first preferred embodiment of the present invention.

FIG. 1 schematically shows an apparatus for wafer treatment for the manufacture of semiconductor devices according to a first preferred embodiment of the present invention.

Referring to FIG. 1, the apparatus for wafer treatment 1 includes a rotatable shaft 2, a gas supply passage 4, a driving motor 6, a chuck 8, a clamp 16, a bowl 20, a chamber 22, a chamber hot wire 24, a solution nozzle 25, a gas supply line 29, and a heater 30.

The shaft 2 is rotated by the driving motor 6, and has the gas supply passage 4 formed in it for carrying a gas. The chuck 8 is supported by the shaft 2 and has a wafer W mounted on it. The clamp 16 fixes to the side of the wafer W mounted on the chuck 8. The solution nozzle 25 supplies a wafer treatment solution onto the surface of the wafer W. The bowl 20 surrounds the chuck 8 to prevent the wafer treatment solution supplied from the solution nozzle 25 from being scattered during the rotation of the chuck 8. The hot chamber 22 houses the chuck 8, the solution nozzle 25, and the bowl 20. The chamber hot wire 24 surrounds the outside of the chamber 22. The gas supply line 29, which is connected to the gas supply passage 4 of the shaft 2, and a flow meter (not shown) form a gas supply means. This gas supply means supplies a gas to the back side of the wafer W. The heater 30 is provided to heat the supplied gas before it is provided to the gas supply line 29.

Figure 2A:
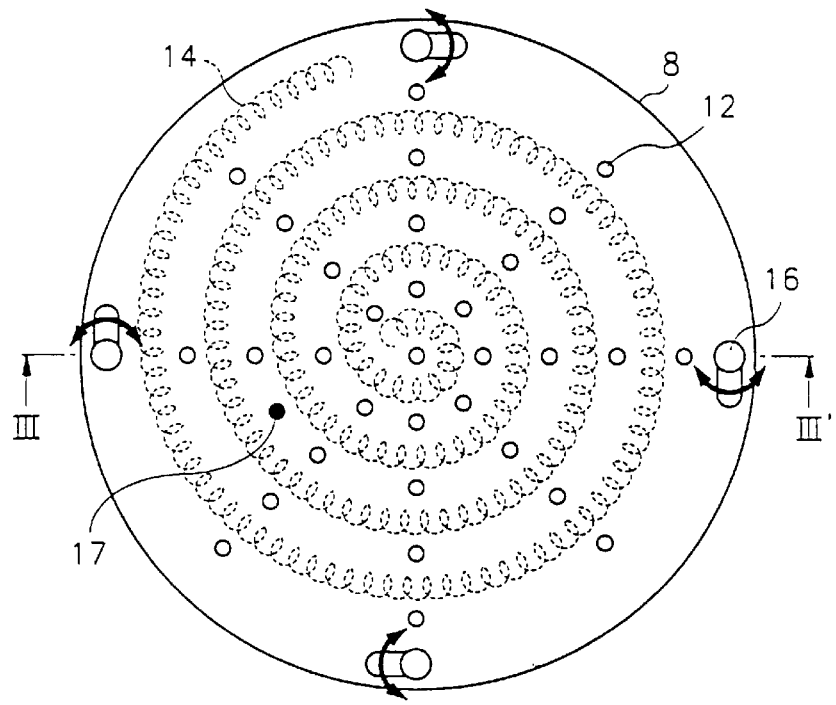
FIGS. 2A to 2C show the chuck of FIG. 1 according to alternate preferred embodiments of the present invention.
Figure 3:
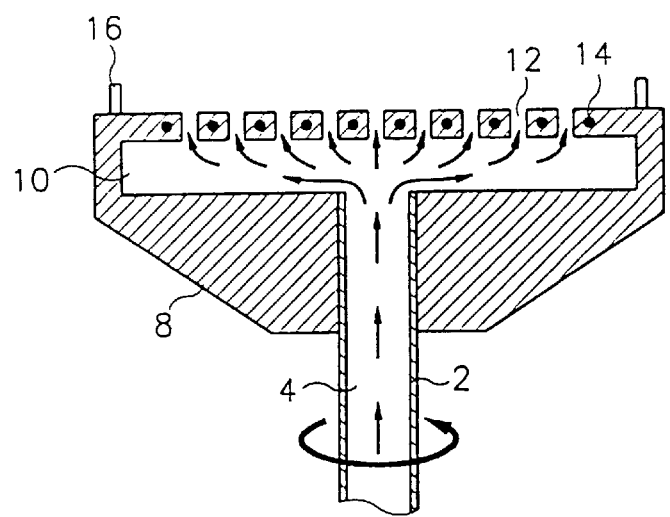
FIG. 3 is a cross section taken along the line III–III' of FIG. 2A.

Referring to FIGS. 2A and 3, and describing the chuck 8 in more detail according to one alternate embodiment, a buffer space 10 is provided under the bottom surface of the chuck 8. This buffer space 10 is connected to the gas supply passage 4 formed in the shaft 2. In addition, a chuck hot wire 14 is provided between the buffer space 10 and the bottom surface of the chuck 8 to heat the wafer W mounted on the chuck 8. This chuck hot wire 14 is preferably spiral-shaped. In addition, a plurality of holes 12 are formed on the chuck 8 in communication with the buffer space 10. The holes 12 preferably are provided on the chuck 8 in the radial direction from the center of the chuck 8, and the diameter of the hole 12 is preferably between 1 mm to 7 mm, most preferably about 3 mm. A wafer sensor 17 is provided on the surface of the chuck 8 for sensing the presence of the wafer W mounted on the chuck 8.

The gas passing through the gas supply passage 4 of the shaft 2 forms a certain pressure in the buffer space 10, and so makes the amount of the gas passing through each of the holes 12 uniform.

As a result, the gas, which is supplied to the buffer space 10 from the gas supply passage 4 and which is heated by the heater 30, is supplied to the back side of the wafer W through the holes 12 so as to form a gas cushion 18 between the chuck 8 and the wafer W mounted on the chuck 8.

The heater 30 preferably heats the gas passing through the gas supply line 29 to a temperature of about 30° C. to 150° C., most preferably to a temperature of about 65° C. to 85° C. Preferably, an inert gas, such as nitrogen gas ($N_2$), is used as the supplied gas.

Figure 4:
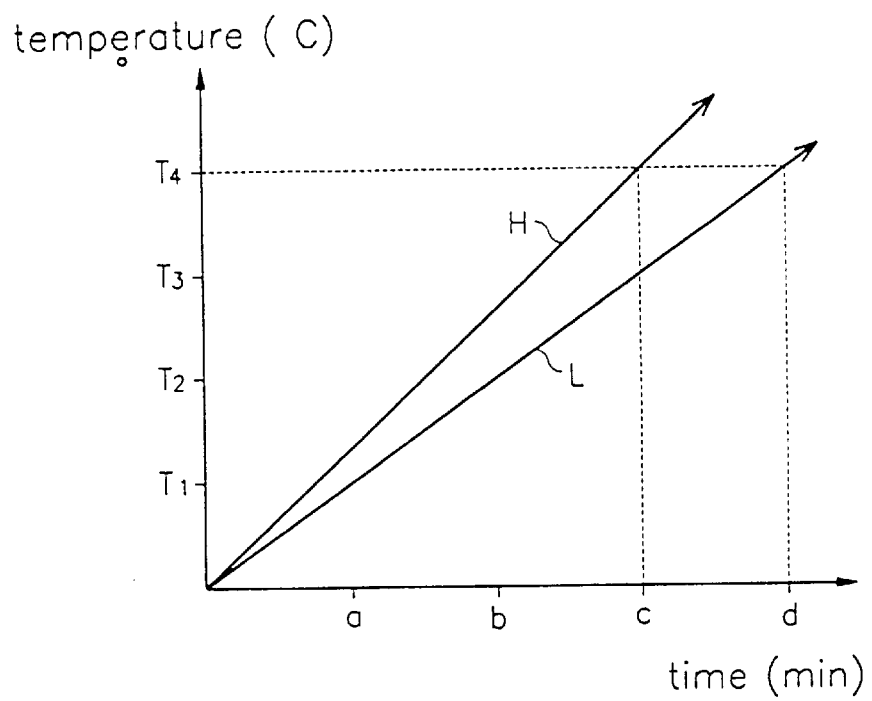
FIG. 4 is a graphical representation showing the changes of the temperature on the chuck surface as they vary in time to compare the two cases when a hot wire is provided inside the chuck and when no hot wire is provided in the chuck.

FIG. 4 is a graphical representation showing the changes of the temperature on the surface of the chuck 8 as they vary in time, comparing the chuck 8 when it has a wire placed in it and when it has no wire placed in it.

Referring to FIG. 4, the line "H" shows the time variation until the surface temperature of the chuck 8 reaches a specific temperature ($T_4$) in the case where the chuck hot wire 14 is placed inside the chuck 8. The line "L" shows the time variation until the surface temperature of the chuck 8 reaches a specific temperature ($T_4$) in the case where a chuck hot wire 14 is not placed inside the chuck 8. Comparing the lines "H" and "L," it can be seen that it takes less time for the surface temperature of the chuck 8 to reach the specific temperature ($T_4$) when the chuck hot wire 14 is placed inside the chuck 8, as shown in the line "H". Therefore, the process time can be reduced by the time difference (d-c) if the hot wire 14 is placed inside the chuck 8.

Figure 2B:
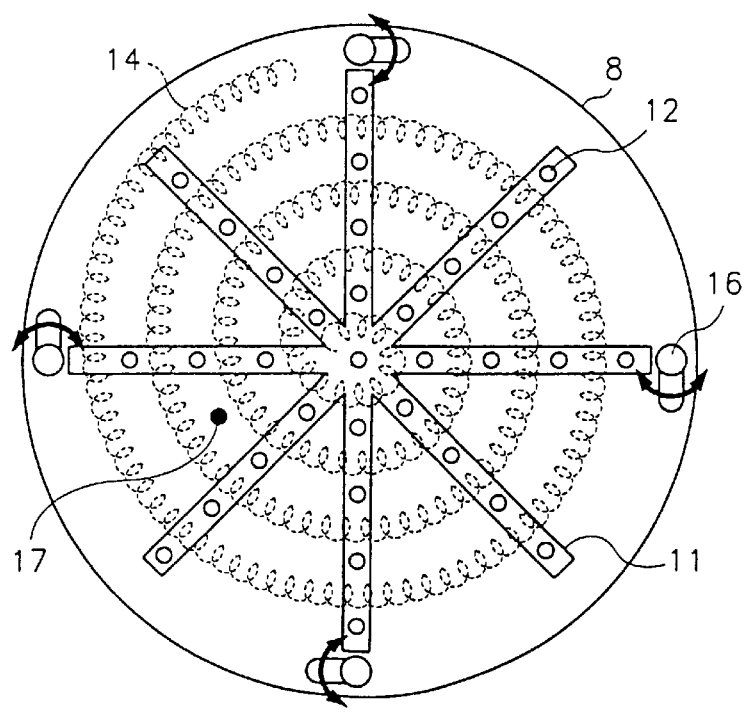
Figure 2C:
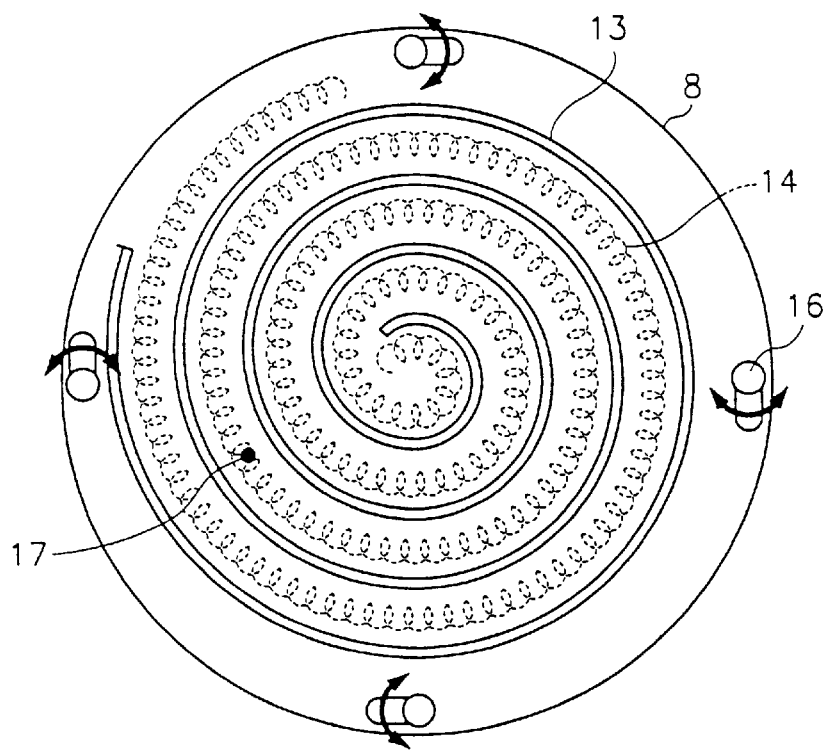

FIGS. 2B and 2C show alternate embodiments of the chuck 8 of the present invention. The embodiments shown in the FIGS. 2A, 2B, and 2C are all similar in that each has a buffer space 10, a chuck hot wire 14, and a wafer sensor 17. They differ in that for each alternate embodiment, the chuck 8 has a different surface structure.

Referring to FIG. 2B, a groove 11 may be provided on the surface of the chuck 8, and the groove 11 may be radially extended from the center of the chuck 8 with a plurality of rectangular channels having a certain depth. The holes 12 are provided inside the groove 11 and each hole has an identical shape and size, and is formed at an equal interval from each other. The depth of the groove 11 is preferably about 2 mm to 5 mm, and the width of the groove 11 is preferably 2 mm to 10 mm, most preferably 5 mm. The length of the groove 11 is preferably 5 cm to 15 cm. The length of the groove 11 can be varied, however, depending on the diameter of the wafer W. In other words, if the wafer W has a diameter of 200 mm, the length of the groove 11 is most preferably about 10 cm, but if the wafer W has a diameter of 300 mm, the length of the groove is most preferably about 15 cm.

The chuck hot wire 14 is placed under the groove 11, and is preferably 6 mm to 10 mm away from the chuck surface.

Referring to FIG. 2C, a spiral hole 13 may be provided on the surface of the chuck 8 along the spiral chuck hot wire 14 in place of the holes 12. The spiral hole 13 is formed on top of the chuck 8 in communication with the buffer space 10, and is preferably 1 mm to 7 mm in diameter, most preferably 3 mm.

The solution nozzle 25 preferably comprises a treatment solution nozzle 26 for supplying a wafer treatment solution and a deionized water nozzle 28 for supplying deionized water to clean the wafer W after the wafer treatment. If necessary, a plurality of additional solution nozzles 25 can be provided.

In the first preferred embodiment, the treatment solution nozzle 26 and the deionized water nozzle 28 move right and left from the center of the wafer W to supply a treatment solution and deionized water respectively to the surface of the wafer W.

Figure 5:
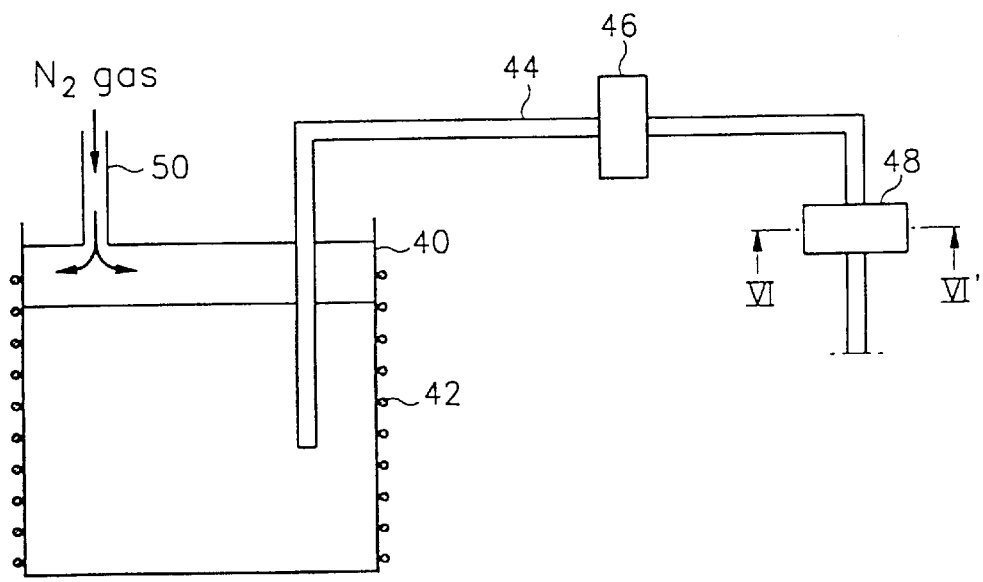
FIG. 5 is a schematic configuration of the treatment solution supply means according to the first preferred embodiment of the present invention.

FIG. 5 schematically shows a treatment solution supply means in communication with the treatment solution nozzle 26 according to the first preferred embodiment.

As shown in FIG. 5, the treatment solution supply means comprises a container 40, a solution hot wire 42, a gas supply line 50, and a treatment solution supply line 44. The solution hot wire 42 is provided outside the container 40 and maintains the treatment solution inside the container 40 at a constant temperature. The gas supply line 50 supplies a pressurized specific gas into the container 40. The treatment solution supply line 44 is in communication with the treatment solution nozzle 26. By supplying a pressurized gas, e.g., nitrogen gas ($N_2$), into the gas supply line 50, a certain amount of the treatment solution is pushed into the treatment solution supply line 44 by means of the pressure of the gas.

Figure 6:
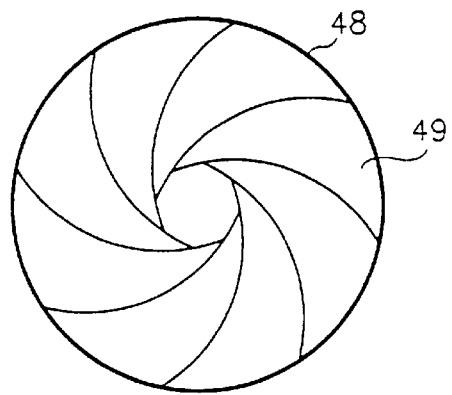
FIG. 6 is a cross section taken along the line VI–VI' of FIG. 5.

A flow meter 46 is also provided on the treatment solution supply line 44, and next to the flow meter 46, a section area control means 48 is provided for controlling the cross-section surface area of the treatment solution supply line 44. The section area control means 48 preferably comprises an iris valve 49, as shown in FIG. 6. By controlling the amount that the iris valve 49 is opened, a fine control of the flow amount of the treatment solution passing through the treatment solution supply line 44 can be obtained. Of course, the flow meter 46 allows some control of the flow amount, but the section area control means 48 allows the finer control of the flow amount.

This supply method of the treatment solution using pressurized gas is more efficient than the pumping method with regard to the preciseness of the process. This is because unlike the pumping method, the pressurized gas method operates independent of the movement of pistons in a pump. As a result, the supply amount of the treatment solution does not run the risk of altering because of a malfunction in the piston movement.

The chamber 22 is provided to minimize the affect on the wafer W of the outside environment during the treatment process for the wafer W. Most preferably, the chamber 22 operates to minimize the temperature changes of the treatment solution supplied on the wafer W. Therefore, a chamber hot wire 24 can be provided outside the chamber 22 to maintain the chamber 22 at a constant temperature. If necessary, an additional hot wire (not shown) can also be provided on the upper side inside the chamber 22. Such an additional hot wire provided in the upper side inside the chamber 22 can be installed inside a tube in order to prevent its direct contact with the gas generated by the treatment solution inside the chamber 22.

The chamber 22 is preferably made of heat-resistance glass having an endurance for heat according to the process characteristics of the treatment process carried out at high temperature. In other words, the chamber 22 is made of a material with sufficient heat resistance to withstand the high-temperature processing. Its surface can be coated or treated with a reflective metal, preferably a gold (Au) coating. A chamber 22 coated with a reflective metal minimizes the discharge of the inner heat out of the chamber 22. It also allows an operator to see through the inside of the chamber 22 with the naked eye because visible light can pass through such a coating.

The chamber hot wire 24 generates heat based on a current flowing through it, which current is controlled by a current controller (not shown). The heat generated by the hot wire 24 increases the inner temperature inside the chamber 22, and efficiently maintains the chamber at a constant temperature, preferably the same temperature as the treatment solution supplied during the wafer treatment process.

As described above, the characteristics of the apparatus for wafer treatment for manufacturing semiconductor devices according to the first preferred embodiment of the present invention is to provide the heater 30 to heat the gas supplied to the back side of the wafer W from the gas supply line 29 attached to the heater 30, and to provide hot wires 14 and 24 on the bottom surface of the chuck 8 and the outside of the chamber 22 to maintain the chamber 22 at a constant temperature.

Accordingly, the temperature changes of the treatment solution can be minimized by reducing the temperature difference between the wafer W and the treatment solution supplied on the wafer W, thereby improving the uniformity of the treatment process itself.

Moreover, since the treatment solution flows over the back side of the wafer W during the treatment process, contamination of the back side of the wafer W can be prevented.

A Second Preferred Embodiment

Figure 7:
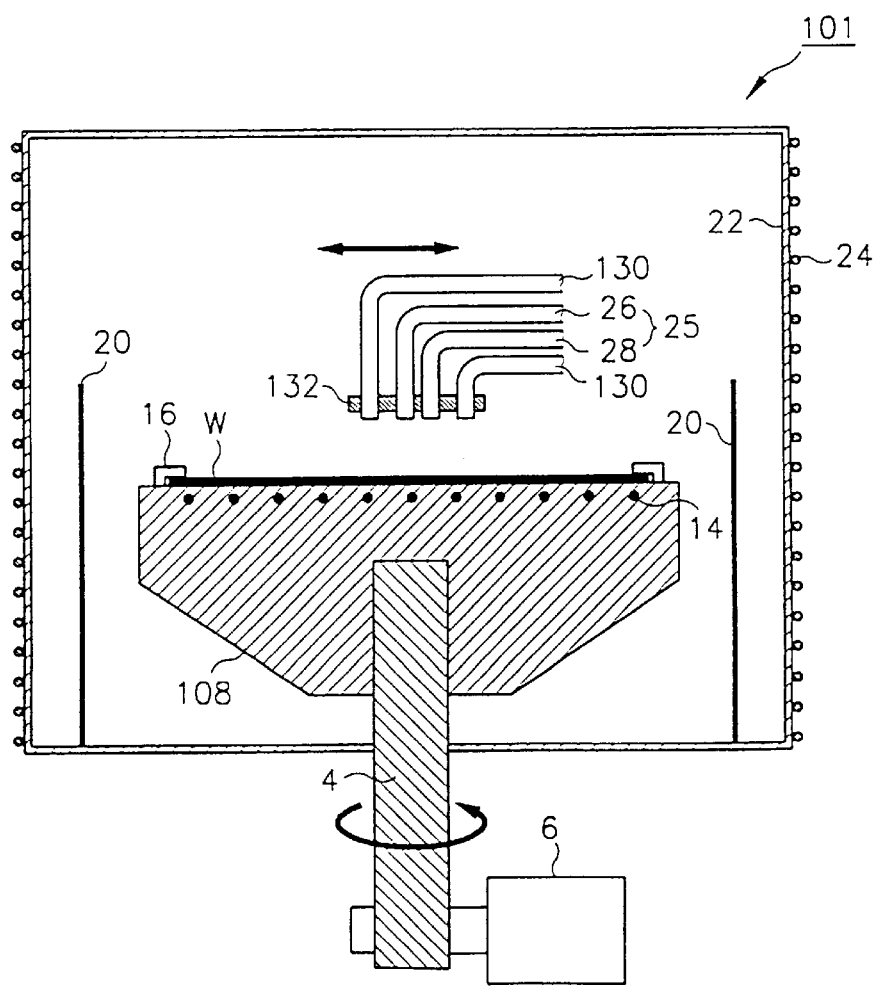
FIG. 7 schematically shows an apparatus for wafer treatment for the manufacture of semiconductor devices according to a second preferred embodiment of the present invention.

FIG. 7 shows an apparatus for wafer treatment for the manufacture of semiconductor devices according to a second preferred embodiment of the present invention.

Like numbers refer to like elements that do same functions as in the first preferred embodiment throughout the description of the second preferred embodiment, and the description of these elements is omitted. However, different numbers are put on the elements whose structure are changed.

Referring to FIG. 7, the apparatus for wafer treatment 101 includes a shaft 4, a driving motor 6, a chuck 108, a chuck hot wire 14, a clamp 16, a solution nozzle 25, a plurality of gas nozzles 130, a bowl 20, a chamber 22, and a chamber hot wire 24. The shaft 4 is rotationally driven by the driving motor 6. The chuck 108 is supported by the shaft 4 and has a chuck hot wire 14 formed inside of it to heat a wafer W mounted on the chuck 108. The chuck hot wire 14 is preferably spirally-shaped. The clamp 16 operates to fix in place the side of the wafer W mounted on the chuck 108. The solution nozzle 25 supplies a wafer treatment solution onto the wafer W. The gas nozzles 130 are provided on both sides of the solution nozzle 25, set apart a certain distance apart from the solution nozzle, to supply a certain gas to the wafer W. The bowl 20 surrounds the chuck 108 to prevent the wafer treatment solution supplied from the solution nozzle 25 from being scattered during the rotation of the chuck 108. The chamber 22 houses the chuck 108, the solution nozzle 25, the gas nozzles 130, and the bowl 20. The chamber hot wire 24 is provided to surround the outside of the chamber 22.

As described above, the characteristics of the present embodiment of the invention is to provide a gas nozzle 130 to the left and the right of the solution nozzle 25 to supply a heated gas. Preferably the gas supplied through the gas nozzle 130 is an inert gas, and more preferably it is nitrogen gas ($N_2$). The temperature of the gas is preferably between about 30° C. to 150° C., and more preferably between about 65° C. to 85° C.

Although this preferred embodiment employs two gas nozzles, any number can be used in alternate embodiments.

The distance between the solution nozzle 25 and the gas nozzles 130 can be controlled according to the process conditions and the diameter of the wafer W. Preferably, the solution nozzle 25 and the gas nozzles 130 are attached in parallel onto a connection rod 132.

In the alternative, the solution nozzle 25 and the gas nozzles 130 can be arranged in a manner such that a gas nozzles 130 and solution nozzles 25 are aligned in an alternating fashion.

Describing an alternate embodiment of the treatment process employing the gas nozzles 130, the gas nozzles 130 may be initially arranged over the center of the wafer W, and then, as the heated gas is supplied through the gas nozzles 130, they can be moved to the peripheral edge of the rotating wafer W.

Likewise, the solution nozzle 25 can be arranged over the center of the wafer W, and as a treatment solution is supplied through the solution nozzle 25, the solution nozzle 25 can also be moved to the peripheral edge of the rotating wafer W, to carry out the treatment process at the same time.

The heated gas supplied by the gas nozzles 130 preferably acts to maintain the wafer W at a temperature comparable to the temperature of the treatment solution. In addition, during etching, the chuck hot wire 14 has current sent though it to also heat the wafer W and maintain the wafer W at a temperature comparable to the temperature of the treatment solution.

The treatment method employing the gas nozzles 130 can be carried out with various modifications, however, which will be apparent to those skilled in the art.

By flowing the heated gas from the gas nozzles 130 onto the wafer W mounted on the rotating chuck 108, and by heating the wafer W via the chuck hot wire 14, the temperature difference between the wafer and the treatment solution supplied on the wafer can be minimized. As a result of this, the uniformity of the treatment process can be improved.

The formation method of conductive plugs (e.g., tungsten plugs) using the apparatus for wafer treatment according to the first present invention as shown in FIG. 1 will now be described. Initially, a wafer W is provided having an oxide layer with contact holes formed in it and a conductive layer (e.g., a tungsten layer) formed over the oxide layer and filling the contact holes. The wafer W is mounted on the chuck 8, which has the chuck hot wire 14 formed within it. A warm gas, e.g., nitrogen gas ($N_2$), having a temperature of about 70° C. is supplied to the back side of the wafer W through the holes 12. In addition, the process environment can be optimized to a desired process temperature by driving the chamber hot wire 24 outside the chamber 22 to increase the inner temperature inside the chamber 22.

An etching process can then be carried out while rotating the chuck 8 and supplying a treatment solution, e.g., an etching solution to etch the conductive layer. In this way, the conductive plugs are formed such that the conductive exist only inside the contact holes, and no conductive material (e.g., tungsten) remains over the rest of the substrate.

When the treatment solution is an etching solution, the etching solution preferably comprises a mixture of at least one oxidant selected from the group consisting of $H_2O_2$, $IO_4$, $BrO_3$, $ClO_3$, $S_2O_8$, $KIO_3$, $H_5IO_6$, KOH, and $HNO_3$, at least one enhancer selected from the group consisting of HF, $NH_4OH$, $H_3PO_4$, $H_2SO_4$, $NH_4F$, and HCl, and deionized water as a buffer solution.

By using the wafer treatment method of the present invention, many problems such as microscratches or the potential breaking of the wafer during a conventional Chemical Mechanical Polishing (CMP) process can be avoided during the formation of conductive plugs such as tungsten plugs.

In addition, the wafer treatment method can be used during a planarization process for thin layers having protrusions as well as in the formation process of the conductive plugs described above.

A thin layer, which may be etched by the etching solution, can be a copper layer (Cu), a titanium layer (Ti), a titanium nitride layer (TiN), a tantalum layer (Ta), a tantalum nitride layer (TaN), or an oxide layer besides the tungsten layer (W).

Therefore, according to the present invention, the formation process of conductive plugs and the planarization process can be efficiently carried out, and the changes of the process temperature of the treatment solution can be minimized, thereby improving the uniformity of the process.

It will be apparent to those skilled in the art that various modifications and variations of the present invention can be made without departing from the spirit or scope of the invention. Thus, it is intended that the present invention cover the modifications and variations of this invention provided they come within the scope of the appended claims and their equivalents.

What is claimed is:

1. An apparatus for wafer treatment for manufacturing semiconductor devices, comprising:
   a shaft;
   a chuck supported by the shaft and for holding a wafer;
   a solution nozzle for supplying a treatment solution to the wafer;
   a gas supplier for supplying a gas to the back side of the wafer; and
   a heater for heating the gas supplied to the back side of the wafer.

2. An apparatus for wafer treatment, as recited in claim 1, wherein a chuck hot wire is provided inside the chuck for heating the wafer held by the chuck.

3. An apparatus for wafer treatment, as recited in claim 1, wherein the shaft includes a gas supply passage for carrying the supplied gas, and the end of the gas supply passage is connected to the gas supplier.

4. An apparatus for wafer treatment, as recited in claim 3, wherein a buffer space is formed under the bottom surface of the chuck, the buffer space being in communication with the gas supply passage.

5. An apparatus for wafer treatment, as recited in claim 4, wherein a plurality of holes are provided on the surface of the chuck in communication with the buffer space.

6. An apparatus for wafer treatment, as recited in claim 5, wherein the holes are provided in a radial direction from the center of the chuck.

7. An apparatus for wafer treatment, as recited in claim 4, wherein a plurality of rectangular-shape grooves are provided on the surface of the chuck in the radial direction from the center of the chuck.

8. An apparatus for wafer treatment, as recited in claim 7, wherein a plurality of holes are provided inside the groove at equal intervals from each other, the holes being in communication with the buffer space.

9. An apparatus for wafer treatment, as recited in claim 1, wherein the gas supplier can supply gas at a temperature between 30° C. to 150° C.

10. An apparatus for wafer treatment, as recited in claim 1, wherein the gas supplier supplies an inert gas.

11. An apparatus for wafer treatment, as recited in claim 10, wherein the gas supplier supplies nitrogen gas ($N_2$).

12. An apparatus for wafer treatment, as recited in claim 1, further comprising a chamber for housing the chuck and the solution nozzle.

13. An apparatus for wafer treatment, as recited in claim 12, wherein the outside of the chamber is surrounded by a chamber hot wire.

14. An apparatus for wafer treatment for manufacturing a semiconductor, comprising;

a shaft;

a chuck supported by the shaft and for holding a wafer;

a solution nozzle for supplying a treatment solution to the wafer; and one or more gas nozzles provided proximate to the solution nozzle, at a certain distance from the solution nozzle, for supplying a certain gas, wherein a chuck hot wire is provided inside the chuck for heating the wafer held by the chuck.

15. An apparatus for wafer treatment, as recited in claim 14, wherein the gas supplier can supply gas at a temperature between 30° C. to 150° C.

16. An apparatus for wafer treatment, as recited in claim 14, wherein the gas supplier supplies an inert gas.

17. An apparatus for wafer treatment, as recited in claim 16, wherein the gas supplier supplies nitrogen gas ($N_2$).

18. An apparatus for wafer treatment, as recited in claim 14, further comprising a chamber for housing the chuck, the solution nozzle, and the gas nozzle.

19. An apparatus for wafer treatment, as recited in claim 18, wherein the outside of the chamber is surrounded by a chamber hot wire.

* * * * *